United States Patent [19]

Kozawa

[11] Patent Number: 4,496,379
[45] Date of Patent: Jan. 29, 1985

[54] CANISTER FOR VOLATILE FUEL CONTROLLING DEVICE

[75] Inventor: Tadashi Kozawa, Aichi, Japan

[73] Assignee: Aisan Industry Co., Ltd., Aichi, Japan

[21] Appl. No.: 584,838

[22] Filed: Feb. 29, 1984

Related U.S. Application Data

[62] Division of Ser. No. 337,651, Jan. 7, 1982, Pat. No. 4,448,594.

[30] Foreign Application Priority Data

Jan. 27, 1981 [JP] Japan .............................. 56-10580[U]

[51] Int. Cl.³ .............................................. B01D 39/00
[52] U.S. Cl. ......................................... 55/387; 55/316; 123/519
[58] Field of Search ................... 55/387, 316; 123/519

[56] References Cited

U.S. PATENT DOCUMENTS 3,191,587  6/1965  Hall ..................................... 123/519
4,306,894 12/1981  Fukami et al. ........................ 55/316
4,338,106  7/1982  Mizuno et al. ........................ 55/316

Primary Examiner—Bernard Nozick
Attorney, Agent, or Firm—Martin A. Farber

[57] ABSTRACT

A canister for a volatile fuel controlling device having a volatile fuel inlet, a mixture outlet and an air introduction port, in which a baffle is provided within a volatile fuel absorbent layer for restricting the flow of the volatile fuel and air between the volatile fuel inlet and mixture outlet side and the air introduction port side, so that the absorbing efficiency of the volatile fuel by the absorbent and the eliminating efficiency thereof from the absorbent can be increased, thereby contributing to the minimization of canister size and the prevention of unburned gas emission.

6 Claims, 12 Drawing Figures

CANISTER FOR VOLATILE FUEL CONTROLLING DEVICE

BACKGROUND OF THE INVENTION

This is a division of application Ser. No. 337,651, filed Jan. 7, 1982 now U.S. Pat. No. 4,448,594.

FIELD OF THE INVENTION

The present invention relates to a canister for volatile fuel controlling device in an internal combustion engine.

DESCRIPTION OF THE PRIOR ART

A volatile fuel controlling device is well known in which the volatile fuel generated from a fuel tank, fuel reservoir of a float chamber in a carburetor and the like is gathered by a canister without being exhausted in the atmosphere and thus gathered volatile fuel is drawn from the canister in association with the operation of the engine for combustion purposes. Recently the permissible levels of volatile fuel emissions in the atmosphere have been severely restricted and therefore it is required to properly control the emission of volatile fuel from the volatile fuel controlling system.

As a countermeasure of the above-mentioned problem, it has been suggested to increase the amount of absorbent such as activated carbon filled inside of the canister, by which a large amount of volatile fuel is caught so as to prevent the emission thereof into the external air. This idea is disadvantageous, however, in that the canister becomes inevitably of large size, which results in an increase of manufacturing cost and a difficulty of mounting it in a small-sized vehicle.

Another countermeasure has also been suggested such that the scavenging effect of the canister is increased so that a large amount of volatile fuel can be caught by a relatively small amount of absorbent filled inside of the canister. This method is indeed advantageous in that an increase in the amount of scavenged air in the canister insures a control of a large amount of volatile fuel with only a small amount of absorbent. However, this method also has problems because it causes a decrease of the engine feeling and affects the density of air-fuel mixture, which results in an increase of the amount of unburned component remaining within the exhaust gas.

SUMMARY OF THE INVENTION

The present invention has been suggested to provide a canister for a volatile fuel controlling device which includes a baffle arranged within an absorbent layer so as to enhance extremely the absorption effect and separation effect of the absorbent, thereby making the canister of a compact size, insuring a stable engine operation, and further preventing an unburned gas component and volatile fuel from being exhausted into the air.

The above and other objects, as well as advantageous features of the invention will become clear from the following description of the preferred embodiments taken in conjunction with the accompanying drawings.

DESCRIPTION OF THE PREFERRED EMBODIMENTS

The present invention will now be described in detail with reference to the embodiments shown in accompanying drawings.

Figure 1:
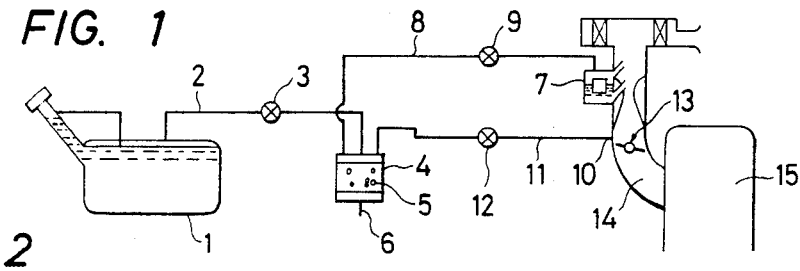
FIG. 1 a schematic view of an example of volatile fuel controlling device.

Referring to FIG. 1, a fuel tank 1 and a canister 4 are interconnected to communicate through a first volatile fuel passage 2 which includes a pressure regulating valve 3 at an intermediate point thereof. The canister 4 is also connected to a carburetor float chamber 7 to communicate through a second volatile fuel passage 8 which includes a passage on-off valve 9 at an intermediate point thereof. A volatile fuel extraction hole 10 is provided in the intake passage 14 to the engine 15 at a border of the upstream side and the downstream side of a throttle valve 13. The hole 10 is opened corresponding to an increase in the opening degree of the throttle valve 13 so as to communicate the intake passage 14 with the canister 4 through a mixture passage 11. The above-mentioned three passages 2, 8 and 11 all open on one and the same side of an absorbent 5 disposed within the canister 4 and on the other side of the absorbent 5 there opens an air introduction port 6.

Next, the construction of the canister for a volatile fuel controlling device of the present invention shown in FIG. 1 will be described with reference to FIG. 2.

A canister case 16 has two inlet tubes and one outlet tube all open on one and the same side of the absorbent 5, namely a first inlet tube 17 communicating with the first volatile fuel passage 2, a second inlet tube 18 communicating with the second volatile fuel passage 8, and an outlet tube 19 communicating with the mixture passage 11. An evaporation chamber 20 communicating with the first inlet tube 17 opens inside of the adsorbent 5 through a first separation cylinder 22. The second inlet tube 18 and the outlet tube 19 are communicated through a second evaporation chamber 21. These two evaporation chambers 20 and 21 are separated from each other by the separation cylinder 22 but communicated with each other inside of the absorbent 5 layer.

A baffle 25 is secured to the separation cylinder 22 by means of retainers 27. The evaporation chambers 20 and 21 are in a mutual communication through passages 30 provided within the baffle 25 and also through the absorbent 5. The first evaporation chamber 20 communicates with the air introduction port 6 inside of the absorbent 5 through the passages 30 and ventilation holes 26.

The absorbent 5 is sandwiched between filters 24a, 24b and 24c and keep plates 23a, 23b and 23c and held in position within the canister case 16 by pushing up one of the keep plates allotted with numeral 23c by means of a resilient member 28 disposed between the keep plate 23c and a canister cover 29, which is combined with the canister case 16.

The baffle 25 is positioned at a place opposing the respective evaporation chambers 20 and 21.

Figure 3:
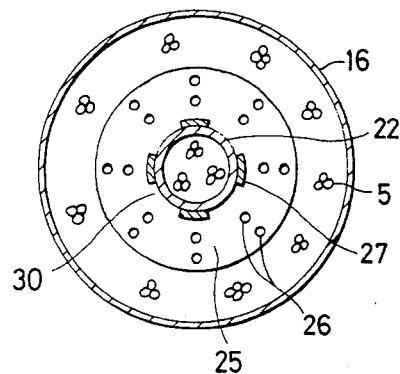
FIG. 3 is a laterally sectioned view of FIG. 2 taken along line I—I.

FIG. 3 shows a state in which the baffle 25 is secured to the separation cylinder 22 through the retainers 27. As clearly seen from this figure, the baffle 25 is provided with a plurality of ventilation holes 26.

Figure 2:
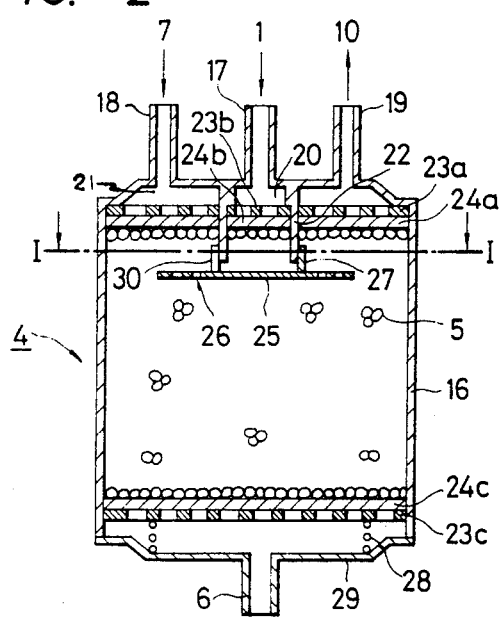
FIG. 2 is a sectional view of an example of a canister for a volatile fuel controlling device incorporating the present invention.
Figure 4:
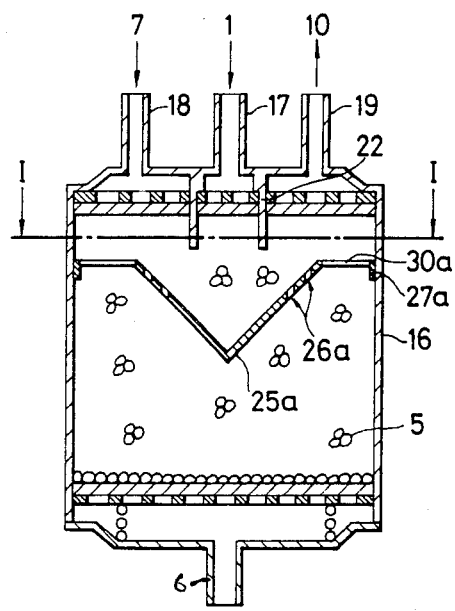
FIG. 4 shows a modification of the canister shown in FIG. 2.

The description will proceed to the modification in FIG. 4 of the canister shown in FIG. 2, but the description is restricted only to the modified part.

In FIG. 2, the plate-like baffle 25 is secured to the separation cylinder 22 inside of the absorbent 5 layer through the retainers 27. Different from this baffle shape and baffle securing structure in FIG. 2, in FIG. 4, a conical baffle 25a is secured up-side-down to the inner wall of the canister case 16 within the absorbent 5 layer by means of retainers 27a provided on the outer periphery of the baffle 25a. The baffle 25a is provided with the passages 30a and ventilation holes 26a, through which the two evaporation chambers 20 and 21 are communicated with the air introduction hole 6 inside of the absorbent 5 layer.

Figure 5:
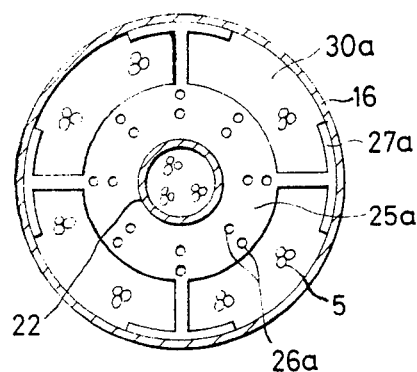
FIG. 5 is a laterally sectioned view of FIG. 4 taken along line I—I.

FIG. 5 shows a state in which the baffle 25a is secured to the canister case 16 through the retainers 27a.

Figure 6:
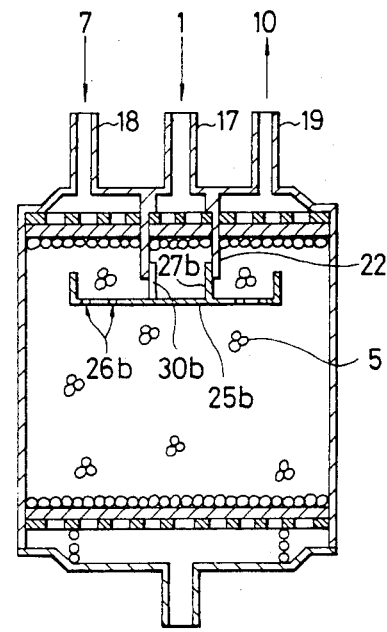
FIGS. 6 through 10 show modifications of the canister shown in FIG. 2.

FIG. 6 shows another modification of the canister of FIG. 2 and an explanation will be made on the modified part thereof.

Different from the canister shown in FIG. 2, wherein the plate-like baffle 25 is secured to the separation cylinder 22 inside of the absorbent 5 layer through the retainers 27, in the canister shown in FIG. 6, a dish-like baffle 25b is secured to the separation cylinder 22b inside of the absorbent 5 layer through the retainers 27b.

Figure 7:
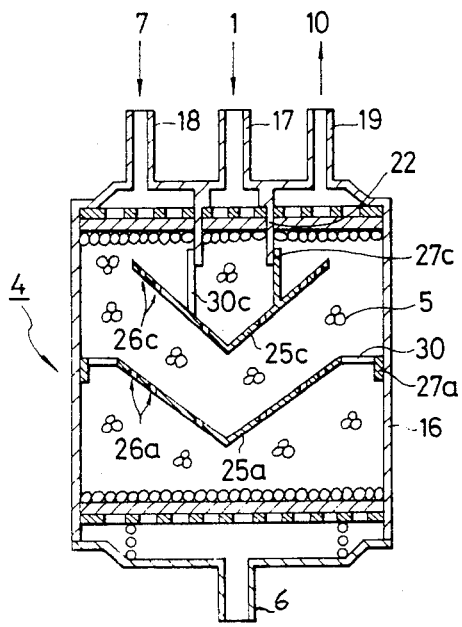

FIG. 7 shows a further modification of the canister of FIG. 2 and an explanation will be made on the modified part thereof.

Though in the canister shown in FIG. 2 the plate-like baffle 25 is secured to the separation cylinder 22 inside of the absorbent 5 layer through the retainers 27, in the canister shown in FIG. 7, a first conical baffle 25c is secured up-side-down to the separation cylinder 22 within the absorbent 5 layer by means of retainers 27c and a second conical baffle 25a is secured up-side-down to the inner wall of the canister case 16 within the absorbent 5 layer by means of retainers 27a. These baffles 25a and 25c are disposed within the absorbent 5 layer which is provided between the upper two evaporation chambers 20 and 21 and the lower air introduction port 6 in such a position as opposes these respective evaporation chambers.

Figure 8:
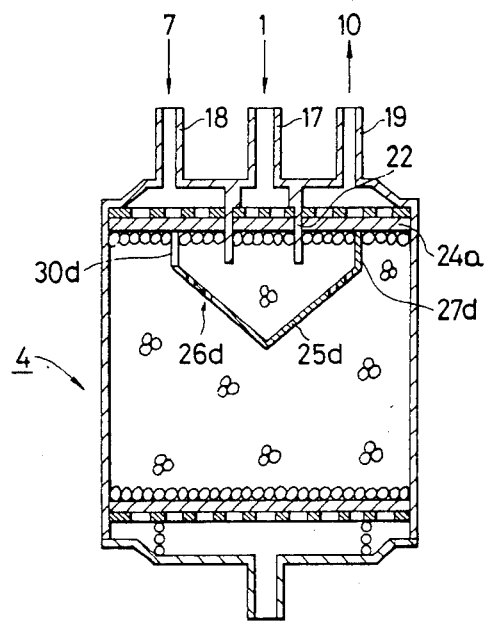

FIG. 8 shows a still further modification of the canister shown in FIG. 2, and an explanation will be made on the modified part thereof.

Different from the above-mentioned arrangement of the baffle 25 in FIG. 2, in FIG. 8 a conical baffle 25d is secured up-side-down to a filter 24b within the absorbent 5 layer by means of retainers 27d.

Figure 9:
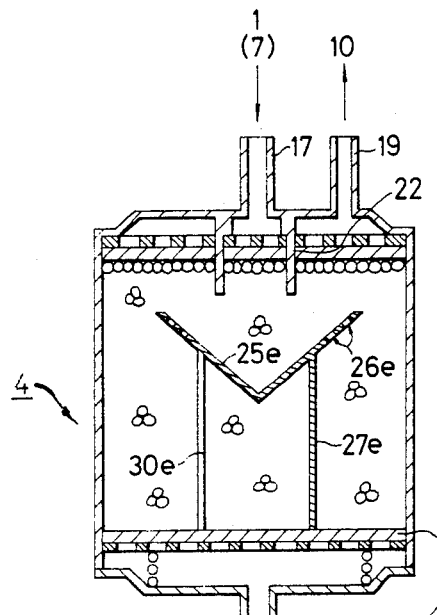

A still further modification of the canister of FIG. 2 is shown in FIG. 9 and the modified part thereof will be explained.

The modified points are two. That is, in the canister of FIG. 2, the plate-like baffle 25 is secured to the separation cylinder 22 within the absorbent 5 layer by means of the retainers 27, whereas in the canister shown in FIG. 9, a conical baffle 25e is secured to the filter 25c up-side-down inside of the absorbent 5 layer by means of retainers 27e. Further, the former canister catches the volatile fuel from two volatile fuel sources, whereas the latter canister catches the volatile fuel from one volatile fuel source.

Figure 10:
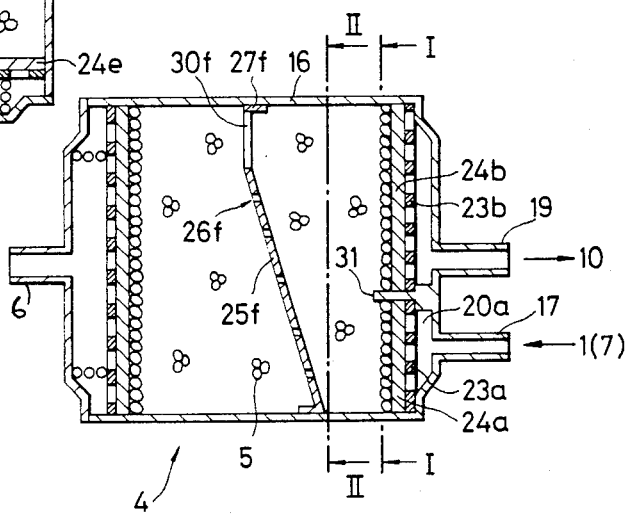

FIG. 10 illustrates a modification of the canister of FIG. 4 and its modified part will now be described in detail.

At first, referring to FIG. 4, the conical baffle 25a is secured up-side-down to the inner wall of the canister case 16 of a vertical type canister 4 of a cylinder form through the retainers 27a that the volatile fuel from two volatile fuel sources can be caught. On the other hand, referring to FIG. 10, a plate-like baffle 25f is secured to the inner wall of the canister case 16 of a lateral type canister 4 of a rectangular form through retainers 27f so that the volatile fuel comes from a single volatile fuel source.

Figure 11:
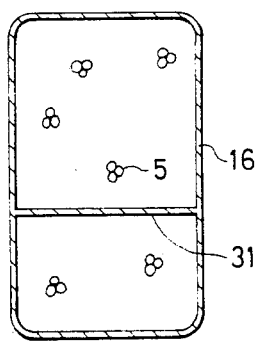
FIG. 11 is a laterally sectioned view of FIG. 10 taken along line I—I.

FIG. 11 is a laterally sectioned view of the canister of FIG. 10 taken along line I—I, which illustrates a state in which a separation plate 31 divides the absorbent 5 layer into two parts.

Figure 12:
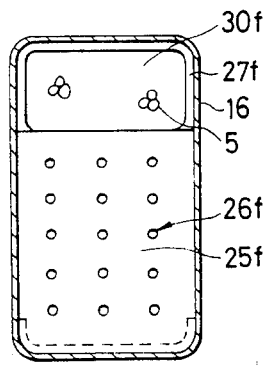
FIG. 12 is a laterally sectioned view of FIG. 10 taken along line II—II.

FIG. 12 is a laterally sectioned view of the canister of FIG. 10 taken along line II—II, which illustrates a state of the baffle 25f secured to the inner wall of the canister case 16 and ventilation holes 26f and passages 30f formed in the baffle 25f.

Now, the description will proceed to how the volatile fuel is caught by the absorbent in the respective canisters having the aforementioned and illustrated constructions.

In the cases of FIGS. 1 and 2, when the volatile fuel generated in the fuel tank 1 in the engine stop condition reaches a pressure exceeding a predetermined value, the pressure regulating valve 3 is made to open by the increased pressure and the volatile fuel flows through the first volatile fuel passage 2, first inlet tube 17 of the canister 4, evaporation chamber 20, keep plate 23b and filter 24b into the absorbent 5 layer, by which the fuel is caught.

The volatile fuel flowing from the evaporation chamber 20 inside of the absorbent 5 layer shows an inclination to flow along the opening direction of the separation cylinder 22 due to its own weight and flowing speed. The fuel flowing out of the separation cylinder 22, however, collides with the baffle 25 provided at a position opposing the opening of the separation cylinder 22 and is forced to change its flowing direction. In this instance, the flowing speed of the volatile fuel is decreased and therefore, the volatile fuel is caught by the whole absorbent 5 within the absorbent layer.

It should be noted that the reason why the baffle 25 is provided with the ventilation holes 26 is to permit the volatile fuel to be caught sufficiently by the absorbent 5 downstream of the baffle 25.

On the other hand, the volatile fuel generated in the carburetor float chamber 7 flows through the second volatile fuel passage 8, second inlet tube 18 of the canister 4, evaporation chamber 21, keep plate 23a, and filter 24a into the absorbent 5, by which the fuel is caught. The fuel flowing from the evaporation chamber 21 into the absorbent 5 layer shows an inclination to flow along the direction toward the air introduction port 6 of the canister case 16 due to its own weight and flowing speed. However, the fuel collides with the baffle 25 arranged to oppose the evaporation chamber 21 and is forced thereby to change its flowing direction. In this instance, the flowing speed of the volatile fuel is decreased and therefore, the volatile fuel is caught by the whole absorbent 5 within the absorbent layer. At this time, the passage on-off valve 9 remains open. To the contrary, the passage control valve 12 remains closed because the intake manifold 14 is applied with no suction negative pressure. As a consequence of this, the canister is not scavenged.

When the engine 15 is in the idling operation, since the volatile fuel extraction hole 10 upstream of the throttle valve 13 is not applied with suction negative pressure though the intake passage 14 which is applied with the suction negative pressure, the passage control valve 12 remains closed. Therefore, the canister 4 is not scavenged also at this time. In this instance, the passage on-off valve 9 is in a closed position.

When the engine 15 is idling, the intake manifold 14 is applied with the suction negative pressure whereas the volatile fuel extraction hole 10 upstream of the throttle valve 13 is not applied with any suction negative pressure. Accordingly, the passage control valve 12 is in a closed condition and the scavenging is not carried out in the canister 4. In this instance, the passage on-off valve 9 is also in a closed condition.

Next, when the engine 15 operation enters a low or acceleration range, accompanying the increase in the opening degree of the throttle valve 13, the suction negative pressure acts on the volatile fuel extraction hole 10 positioned at the border between the upstream side and the downstream side of the throttle valve 13. Therefore, the passage control valve 12 is opened so that air for scavenging the canister 4 is introduced through the air introduction port 6. This scavenging air flow through the absorbent 5 layer eliminates the volatile fuel contained within the absorbent 5. The mixture comprising the scavenging air and the volatile fuel flows through the mixture passage 11, passage control valve 12, volatile fuel extraction hole 10, and intake manifold 14 into a combustion chamber not shown. The baffle 25 within the absorbent 5 layer works as a throttle for the scavenging air flow passage. Then the scavenging air flows through the absorbent 5 layer at an increased speed, which enables a sufficient elimination of the volatile fuel contained within any small holes of the absorbent 5. Also in this instance, the ventilation holes 26 provided in the baffle 25 are very useful to make the scavenging air flow completely through a part just below the baffle 25 so that the volatile fuel contained there can be removed sufficiently. The passage on-off valve 9 is closed at this time.

In either cases of the engine stop and engine operation, when the inside pressure of the fuel tank 1 becomes negative due to the fuel consumption, the pressure regulating valve 3 is opened and air is introduced into the fuel tank 1 through the air introduction port 6 of the canister 4, thereby regulating the inside pressure of the fuel tank 1 to be substantially constant.

The modified canisters in FIGS. 4, 6, 7 and 8, though different from the one shown in FIG. 2 in the shape and the retaining structure of the baffle provided within the absorbent layer, work substantially in the same way as stated in the foregoing with respect to the FIG. 2 canister.

Similarly, the modified canister in FIG. 9, though different from the one shown in FIG. 2 in the shape and the retaining structure of the baffle provided within the absorbent layer and in the elimination of the second inlet tube 18, works substantially in the same way as in the FIG. 2 canister.

Similarly, the modified canister in FIG. 10, though different from the FIG. 2 canister in the lateral positioning of the canister case 16, the shape and the retaining structure of the baffle provided within the absorbent layer, and the elimination of the second inlet tube 18, works substantially in the same way as in the FIG. 2 canister.

The following effects can be obtained commonly with the respective canisters described in the foregoing and illustrated in the drawings:

(1) In the process of catching the volatile fuel by the absorbent, the volatile fuel flowing from the fuel reservoir side to the air introduction port side is changed in the flowing direction by the baffle and decreased in flowing speed simultaneously. This enables the whole absorbent to catch the volatile fuel sufficiently. Thus, the volume of the volatile fuel caught by the absorbent can be remarkably increased.

(2) In the process of eliminating the volatile fuel from the absorbent, the passage area of the scavenging air is reduced by the provision of the baffle, and therefore, the scavenging air flows at an increased speed. As a result of this, the suction negative pressure generated in the vicinity of the surface of the absorbent becomes relatively large, so that the volatile fuel attached inside of the small holes of the absorbent can be easily eliminated. Thus, the volume of the volatile fuel thus eliminated can be remarkably increased.

(3) As mentioned in the preceding two items, the volatile fuel catching efficiency as well as the volatile fuel eliminating efficiency of the canister can be greatly enhanced. Accordingly, only a small amount of absorbent can prevent a large amount of volatile fuel from being emitted to the exterior. This results in the minimization of the canister size, the decrease of the manufacturing cost of the canister, and further, the improvement of the mountability thereof on a vehicle.

(4) It is possible to control a large amount of volatile fuel without increasing the scavenging air amount. Therefore, the affect on the density of the air-fuel mixture can be minimized and the stability of the exhaust gas at the engine idling operation can be much improved.

These effects can also be obtained if the volatile fuel extraction hole 10 in FIG. 1 is designed to open at a position on the intake side of the engine such as the upstream side of the intake manifold or carburetor venturi part.

These effects can also be obtained irrespective of the number of the volatile fuel sources. That is, in the case of FIG. 1, the volatile fuel sources are two, the fuel tank 1 and carburetor float chamber 7. However, the volatile fuel source may be only one, either of the fuel tank 1 or the carburetor float chamber 7, or may be more than two.

The small-sized canister according to the present invention is advantageous particularly in a motorcycle which has only limited space therefor.

What is claimed is:

1. A lateral type canister for a volatile fuel controlling device comprising
   a laterally oriented canister case having a rectangular cross-section,
   a single volatile fuel inlet and a volatile fuel outlet at one lateral end of said canister case,
   said canister case containing a volatile fuel adsorbent,
   a separation plate divides the adsorbent into two parts between said fuel inlet and said fuel outlet, an air introduction port disposed at another end of said canister case for introduction of scavenging air into said canister case, a plate-like baffle disposed inside said canister in an adsorbent layer of said volatile fuel adsorbent, retainer means for securing said plate-like baffle to the inner wall of the canister case, and said baffle is inclined with respect to said canister case and has an edge extending to a predetermined position spaced from a side of the inner wall of said canister case beyond the fuel inlet and fuel outlet defining a passage between said edge of said baffle and the inner wall of said canister case for movement of both volatile fuel and the scavenging air to the volatile fuel outlet.

2. The canister according to claim 1, wherein said separation plate extends horizontally between said volatile fuel inlet and outlet.

3. The canister according to claim 1, wherein said baffle is inclined in a direction so as to be closer to said one lateral end of said canister case adjacent said volatile fuel inlet and outlet than at other portions thereof.

4. The canister according to claim 1, wherein said baffle is formed with a plurality of ventilation holes.

5. The canister according to claim 4, wherein said volatile fuel outlet and said air introduction port are substantially centrally positioned and said volatile fuel inlet is at a lower narrow side of the inner wall of said canister case opposite an upper side thereof defining said passage.

6. The canister according to claim 5, wherein said baffle is inclined from said edge down and toward said volatile fuel inlet.

* * * * *